United States Patent [19]

Tanuma et al.

[11] Patent Number: 4,554,586

[45] Date of Patent: Nov. 19, 1985

[54] SOLID STATE IMAGE SENSING DEVICE

[75] Inventors: Chiaki Tanuma, Tokyo; Katsunori Yokoyama, Ebina; Yoshiyuki Suda, Yokohama, all of Japan

[73] Assignee: Tokyo Shibaura Denki Kabushiki Kaisha, Kawasaki, Japan

[21] Appl. No.: 484,511

[22] Filed: Apr. 13, 1983

[30] Foreign Application Priority Data

May 12, 1982 [JP] Japan .................................. 57-78328
May 12, 1982 [JP] Japan .................................. 57-78331

[51] Int. Cl.⁴ .............................................. H04N 3/14
[52] U.S. Cl. .................................... 358/213; 358/212
[58] Field of Search ............... 358/227, 216, 215, 214, 358/213, 212; 250/578; 366/127; 310/331, 332, 328

[56] References Cited

U.S. PATENT DOCUMENTS 3,191,913  6/1965  Mettler ................................. 366/127
4,383,170  5/1983  Takagi et al. ........................ 250/578

FOREIGN PATENT DOCUMENTS 53-101939  9/1978  Japan .................................. 358/213

OTHER PUBLICATIONS

K. A. Hoagland: "Television Application of Interline Transfer CCD Arrays", NASA/JPL Conference on Charge Coupled Device Technology and Applications, Wash., D.C., pp. 152–156, Dec. 1976.

Primary Examiner—Gene Z. Rubinson
Assistant Examiner—Stephen Brinich
Attorney, Agent, or Firm—Oblon, Fisher, Spivak, McClelland & Maier

[57] ABSTRACT

A solid state image-sensing device is disclosed which includes a base board fitted with a plurality of connection pins, an interline transfer charge coupled device (IT-CCD) serving as an area sensor, and a pair of bimorph piezoelectric vibrating elements which jointly vibrate to periodically vibrate the IT-CCD relative to an incoming image light in a plane substantially parallel with the surface of the base board, and wherein the piezoelectric vibrating elements are elastically held above the base board by support plates having a spring action, thereby efficiently vibrating the IT-CCD.

12 Claims, 7 Drawing Figures

F I G. 7
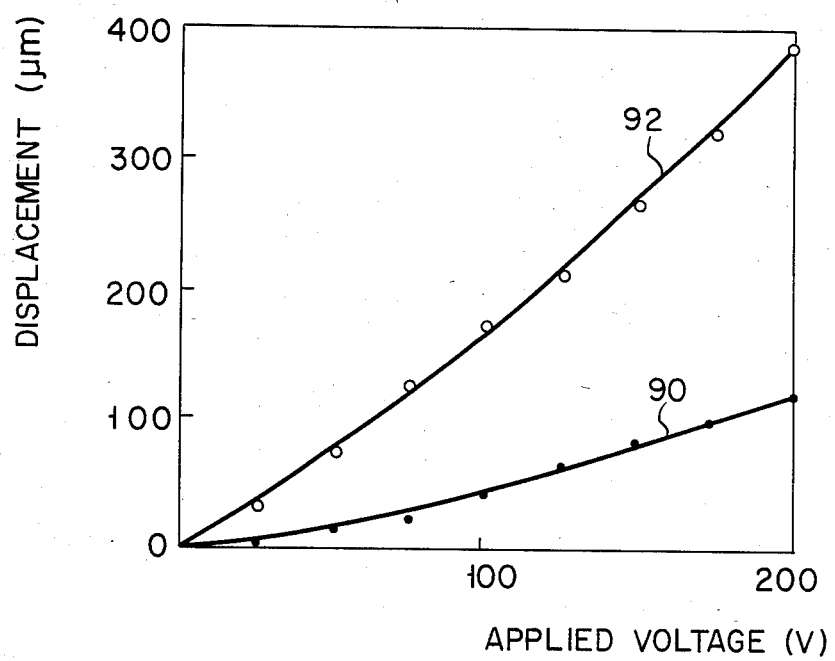

SOLID STATE IMAGE SENSING DEVICE

BACKGROUND OF THE INVENTION

This invention relates to a solid state image sensing device, and more particularly to a solid state image sensing device having a sufficiently high resolving power to produce a precise image.

To date, a charge transfer device (CTD) such as a charge-coupled device (CCD) has been widely accepted as a solid state image sensor adapted for a standard television system, for example, an NTSC television system. This NTSC system rules that the number of vertical scanning lines must be 512; the scanning system must be of an interlacing scanning type with one frame composed of two fields; and the aspect ratio for the TV screen must be 3:4. The number of picture elements of the CCD adapted for the standard television system, for example, interline transfer type CCD (hereinafter referred to as "IT-CCD") is chosen to have 500 (vertical) × 400 (horizontal) picture elements.

Unlike the conventional image pickup tube, a solid state image sensor such as the above-mentioned IT-CCD has excellent image pickup advantages in that it is compact, light, and quite reliable, is essentially free from pattern distortions, has less noticeable afterimage characteristics, and is completely prevented from sticking. Therefore, it is fully expected that a solid state image sensor will be more widely accepted in other fields than that of the conventional television, which includes, for example, ITV, commercial midget video cameras, and electronic still cameras replacing the present day camera using ordinary film prepared from a silver salt. When applied in the above-mentioned various fields, the image sensor must have a high resolving power for improvement of the picture quality.

For further improvement of an image reproduced by the current television system, it is necessary to realize the practical application of a high quality television system capable of presenting a large high precision picture for further use. It is reported as the result of studies on a high quality television that scanning should be made in a larger number of lines than, for example, 1125. For application to this particular technique, a solid state image sensor must have a far higher resolving power than is possible at present.

The aforementioned number of picture elements (about 500 × 400) is obviously insufficient to realize the high resolving power of a solid state image sensor, for example, of the IT-CCD type. Therefore it is contemplated to try to noticeably increase the number of picture elements. However, it should be noted that even the current solid state image sensor occupies the largest chip area among the various LSI elements. If, therefore, it is attempted to cause the image sensor to produce an increased number of picture elements, then the image sensor will become very expensive due to the enlargement of the chip size. If, on the other hand, it is tried to increase picture elements with the image sensor chip restricted to the present size, then it will be necessary to carry out the integration of picture elements with a far greater density (for example, over 4 times) than is currently applied. The method of manufacturing a solid state image sensor by such a high density integration is accompanied with great technical difficulties. Even if the manufacture is made possible due to general technical progress in the future, new problems will be raised in that the drive system of such a solid state image sensor would have a complicated arrangement, leading to a sudden increase in power consumption.

SUMMARY OF THE INVENTION

It is accordingly an object of this invention to provide a new and improved solid state image-sensing device having a high resolving power.

Another object of this invention is to provide a new and improved solid state image-sensing device which includes a vibrating device for causing a solid state image sensor such as a charge transfer device to vibrate or swing relative to an incoming image light, thereby substantially elevating the resolving power of the solid state image sensor without enlarging the size of its chip or increasing the density with which picture elements are integrated.

Still another object of this invention is to provide a new and improved solid state image-sensing device which includes a vibrator for causing a solid state image sensor such as a charge-coupled device to efficiently vibrate or swing relative to an incoming image light, and has substantially as high a resolving power as a charge-coupled device having a large number of picture elements without enlarging the chip size of said image sensor or increasing the density with which picture elements are integrated.

To attain the above-mentioned objects, this invention provides a solid state image-sensing device comprising a solid state image sensor element which has the ordinary number of picture elements and produces an electric image pickup signal corresponding to an incoming image light. The image sensor element periodically changes its position or vibrates relative to an incoming image light by means of a vibration device formed of a piezoelectric element. When one frame consists of a plurality of fields, the piezoelectric element periodically vibrates the image sensor element, causing it to occupy a different image pickup position while the image sensor element has a different field period.

Consequently, the number of the picture elements of an image picked up by the image sensor which makes the above-mentioned vibration is substantially increased, thereby producing a highly precise image without increasing the number of the picture elements of the image sensor element itself.

BRIEF DESCRIPTION OF THE DRAWINGS

The present invention is best understood by reference to the accompanying drawings, in which:

FIG. 7 graphically shows the relationship between the displaced position of the bimorph piezoelectric element of the image-sensing device of FIG. 6 and the magnitude of the voltage applied thereto.

DETAILED DESCRIPTION OF THE PREFERRED EMBODIMENTS

Description will now be given by reference to FIG. 1 of a solid state image-sensing device according to a first embodiment of this invention which is adapted for the NTSC television system, wherein the solid state image sensor itself vibrates or swings relative to an incoming image light. A charge-coupled device 10 such as an interline transfer type charge-coupled device (hereinafter referred to as the "IT-CCD") has an ordinary number of (for example, 500×400) picture elements. The IT-CCD 10 is periodically displaced relative to an incoming image light in the opposite directions indicated by arrows 18 by two spatially arranged rectangular plate-shaped open-side type bimorph piezoelectric elements 14 and 16 (prepared, for example, from ceramic material).

Figure 2:
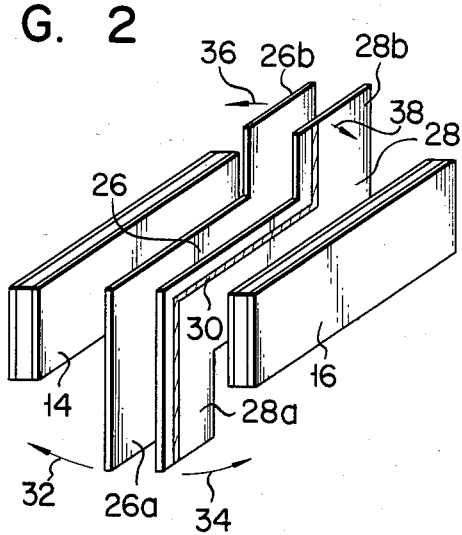
FIG. 2 is a fractional oblique view of the open-side type bimorph piezoelectric element and film connector used with the image sensing device of FIG. 1.

A base plate (referred to as "a mother board") has a plurality of electrode pins 22 arranged along both edges of the base plate in a state connected to, for example, external IC sockets (not shown). A support block 24 is fixed on the mother board 20. The bimorph piezoelectric elements 14 and 16 are fixed at one end to the support block 24 by means of, for example, adhesive. As shown in FIG. 2, the bimorph piezoelectric elements 14 and 16 are securely fixed in place with flexible print wiring connectors 26 and 28 (hereinafter referred to as "film connectors") interposed therebetween. The film connectors 26 and 28 jointly effect the electrical connection between the IT-CCD 10 and the electrode pin 22 of the mother board 20, thereby supplying an electrical image signal produced from the IT-CCD 10 to the electrode pins 22. The rectangular plate-like piezoelectric elements 14 and 16 are fixed in place by the support block 24 substantially at right angles to the surface of the mother board 20. Accordingly, the free end of the piezoelectric elements 14 and 16 can freely vibrate in a horizontal direction indicated by the arrows 18. The main surface of the piezoelectric elements 14 and 16 are provided with electrodes (not shown) to be connected to an external circuit through the electrodes.

The IT-CCD 10 is fixed by adhesive to that side of the vibrating free end portion of the whole mass consisting of the piezoelectric elements 14 and 16 and the intervening film connectors 26 and 28 joined together which represents the thickness of the whole mass. The film connectors 26 and 28 are shaped like one letter Z viewed laterally, and are provided with print wirings 30 extending parallel to each other along the outline of the letter Z. The film connectors 26 and 28 are respectively bent at one ends 26a and 28a in the directions of arrows 32 and 34 as indicated in FIG. 2. The bent portions 26a and 28a are projectively fitted along the mutually facing edges of the IT-CCD 10 (FIG. 1). The film connectors 26 and 28 are respectively bent at the other ends 26b and 28b in the directions of arrows 36 and 38 shown in FIG. 2. The bent ends 26b and 28b are respectively connected to connection regions 40 of the mother board 20 which is electrically connected to the pins 22 by patterns (not shown) printed on the mother board 20. Therefore, image pickup signals produced from the IT-CCD 10 are respectively supplied to the pins 22 through the corresponding film connectors 26 and 28. The above-mentioned structure is housed in a package (not shown).

Figure 1:
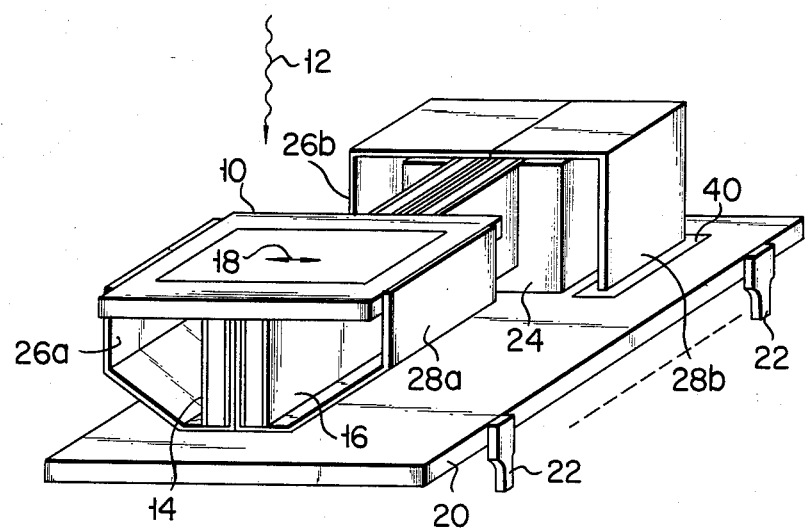
FIG. 1 is an oblique view of the whole of an image-sensing device according to a first embodiment of this invention which comprises an open-side type bimorph piezoelectric element which causes a solid state image sensor such as an IT-CCD to vibrate or swing relative to an incoming image light.
Figure 3:
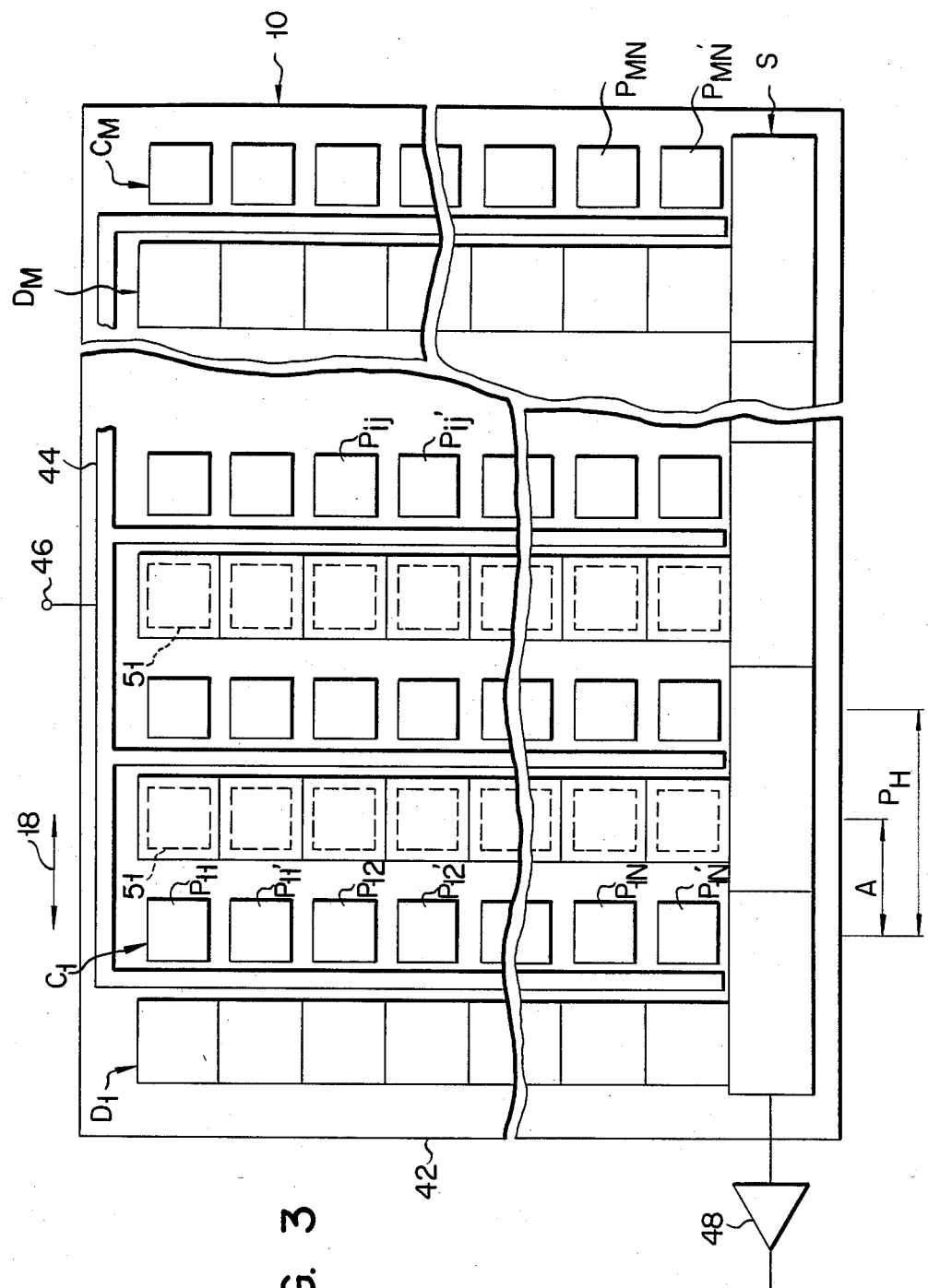
FIG. 3 is a plan view of the IT-CCD of FIG. 1, typically showing its vibration mode.

FIG. 3 is a plan view of the IT-CCD 10 of FIG. 1. This IT-CCD 10 is provided with a plurality of, for example, 2N×M (N=250, M=400) photosensitive elements P such as photodiodes. Photosensitive cells, each formed of these photodiodes P, are arranged on a CCD substrate 42 in the matrix form. The columns $C_1$, $C_2$, ..., $C_M$ of the photosensitive cell matrix are each formed of a 2N number of photodiodes. An M number of the columns $C_1$, $C_2$, ..., $C_M$ are arranged in parallel. An M number of vertical CCDs, $D_1$, ..., $D_M$ are so set as to closely face the M number of photosensitive all columns $C_1$, $C_2$, ..., $C_M$. The vertical CCDs $D_1$, ..., $D_M$ are arranged in number N equal to half that of the vertical picture elements of the photosensitive cell columns $C_1$, $C_2$, ..., $C_M$, namely, the number of photodiodes included in each cell column. The vertical CCDs $D_1$, ..., $D_M$ are connected to a horizontal CCD shift register S in the last transfer stage. A field shift gate (hereinafter abbreviated as FSG) 44 is provided which comprises gate sections extending between the vertical photodiode columns, that is, vertical picture element columns $P_1$, ..., $P_M$ and the vertical CCDs $D_1$, ..., $D_M$. This FSG 44 is electrically connected to a gate terminal 46. When, therefore, a pulse voltage signal (gate control signal) is supplied to the FSG 44 from a CCD driver (not shown) through the gate terminal 46, signal charges, which are generated in response to the incoming image light and stored in the photodiodes P, are transmitted to the vertical CCDs $D_1$, ..., $D_M$. The signal charges transmitted to the vertical CCDs $D_1$, ..., $D_M$ are respectively transferred in succession to the CCD shift register S. The signal charges are issued from an output terminal 50 through an amplifier 48 during a horizontal effective period.

The first embodiment thus arranged in accordance with this invention is adapted to pick up an image by the NTSC television system. Therefore, the IT-CCD 10 is made to vibrate or swing by the piezoelectric elements 14 and 16 during each frame period (2-field period) in the image pickup operation. During the first field period (A field period) included in one frame period, the photosensitive cells P occupy a first image pickup position indicated by solid lines in FIG. 3. During the second field period (B field period) included in one frame period, the IT-CCD 10 is vibrated by the piezoelectric elements 14 and 16, causing the photosensitive cells P of the IT-CCD 10 to occupy a second image pickup position indicated by broken lines 51. This operation is effected by the vibration of the bimorph piezoelectric elements 14 and 16 of FIG. 1 around their own pivotal ends fixed to the support block 24 in the direction of arrows 18. The IT-CCD 10 is chosen to vibrate with an amplitude A preferably corresponding to substantially half the horizontal pitch $P_H$ of two adjacent photosensitive cells. Therefore, during one frame period of the image pickup operation, the IT-CCD 10 is preferred to carry out horizontal space sampling in two places to assure a practical effect. Therefore, unlike the conventional image sensor which picks up the images of both A and B fields during the field periods while resting in a fixed position, the image sensor of this invention can pick up incoming images in different positions during both A and B field periods. With the present image sensor, signals for reading out the cells of both A and B fields, that is, the image signals of both A and B fields are displayed in a state horizontally displaced from each other in conformity with the above-mentioned sampling operation of the CCD. As a result, this invention enables an image to be finally reproduced with a resolving power substantially twice that which is possible with the prior art. In other words, the solid state image-sensing device of this invention can reproduce a high precision image with a superb picture quality and a doubly increased horizontal resolution, as described above.

To achieve the above-mentioned effect, this invention assures the efficient vibration of the IT-CCD 10 by the following improvement in the arrangement of the image sensor-vibrating device including the piezoelectric elements 14 and 16.

The greater part of the film connectors 26 and 28 used for electrical connection between the IT-CCD 10 and the connection pins 22 is sandwiched between the two piezoelectric elements 14 and 16. Accordingly, the film connectors 26 and 28 are prevented from acting as a load for restricting or decreasing the vibration of the piezoelectric elements 14 and 16. Therefore, the piezoelectric elements 14 and 16 can vibrate efficiently, despite the presence of the film connectors 26 and 28 used to effect electrical connections between the piezoelectric elements 14 and 16 and the connection pins 22. Consequently this invention enables an IC element to have sufficient drive power to vibrate a relatively large and heavy IT-CCD 10 to the desired extent.

The IT-CCD 10 is fixed by adhesive to that side of the vibrating free end portion of the whole mass consisting of the piezoelectric elements 14 and 16 and the intervening film connectors 26 and 28 all joined together, which constitutes the thickness of the whole mass. Therefore, the IT-CCD 10 can always vibrate along the same plane in the opposite directions indicated by the arrows 18 during the image pickup operation. The image pickup plane of the vibrating IT-CCD 10 is always held at right angles to the direction in which an incoming image light 12 is received, thereby preventing the picture quality from being deteriorated by the displacement of, for example, the image pickup plane.

Figure 4:
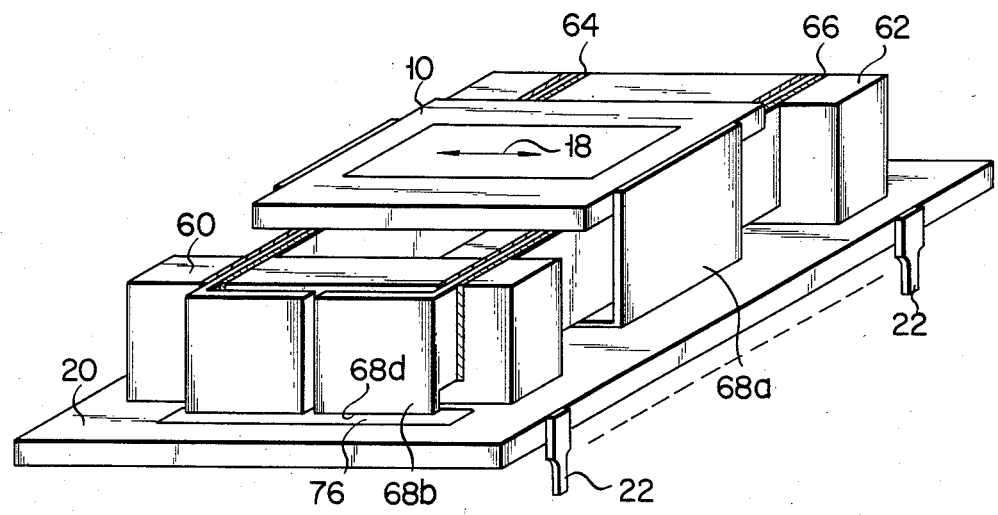
FIG. 4 is an oblique view of the whole of an image-sensing device according to a second embodiment of the invention which comprises two spatially arranged closed side type bimorph piezoelectric elements which vibrate the IT-CCD image sensor.

Description will now be given with reference to FIG. 4 of a solid state image sensing device according to a second embodiment of this invention in which the IT-CCD 10 is vibrated by a side-closed bimorph vibrator. Two support blocks 60 and 62 are fixed to the upper surface of the mother board 20 in a mutually facing state. Two rectangular plate-shaped bimorph piezoelectric elements 64 and 66 are fixed to the surface of the mother board 20 by the support blocks 60 and 62 in a state facing each other at the respective main planes. The piezoelectric plate 64 is fixed at both ends to the two support blocks 60 and 62 by means of, for example, an adhesive, substantially at right angles to the mother board 20. The other piezoelectric plate 66 is also fixed by adhesive at both ends to the support blocks 60 and 62 at right angles to the mother board 20, that is, substantially parallel to the piezoelectric plate 64. Therefore, the two piezoelectric plates 64 and 66 serve as a vibrator fixed at both ends.

Figure 5:
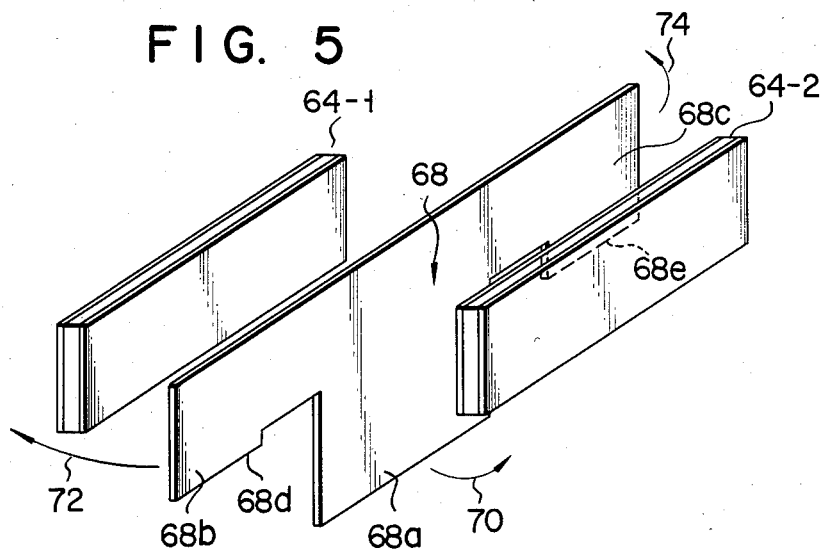
FIG. 5 is a fractional oblique view of a piezoelectric element and film connector used with the image-sensing device of FIG. 4.

As shown in FIG. 5, the piezoelectric plate 64 is formed of a pair of piezoelectric plate components 64-1 and 64-2. These piezoelectric plate components 64-1 and 64-2 are fixed in place by an adhesive with a film connector 68 interposed therebetween. This film connector 68 has a T-shape. One end 68a of this film connector 68 is bent in the direction of arrow 70. This bent portion is fitted to one side of the IT-CCD 10 as shown in FIG. 4. The second and third ends 68b and 68c of the film connector 68 are respectively bent in the directions of arrows 72 and 74. The lower end faces 68d and 68e of the film connector 68 are respectively connected to connection regions 76 formed on the upper surface of the mother board 20. The other piezoelectric plate 66 is constructed in the same manner as the piezoelectric plate 64.

The IT-CCD 10 is fixed by adhesive to the intermediate part of that side of the vibrating free end portion of the whole mass consisting of the two piezoelectric plates 64 and 66 and the intervening film connector 68 all joined together, which represents the thickness of the whole mass. Therefore, the IT-CCD 10 vibrates horizontally in the directions indicated by arrows 18 in accordance with the vibration of the piezoelectric plates 64 and 66. Unlike the solid state image sensor-vibrating device of FIG. 1 according to a first embodiment of this invention, the second embodiment thereof shown in FIG. 4 enables the IT-CCD 10 to vibrate horizontally and more linearly. Further, the two spatially arranged piezoelectric plates 64 and 66 enable the IT-CCD 10 to be securely fixed thereon and also to be easily manufactured.

Description will now be given with reference to FIG. 6 of a solid state image-sensing device including an image sensor-vibrating device according to a third embodiment of this invention. Two rectangular plate-shaped bimorph piezoelectric elements 70 and 72 are fitted to a frame 78 which is fixed to the upper surface of the mother board 20 by means of elastic support plates 74 and 76. The piezoelectric plates 70 and 72 were prepared from the conventional Ternary system piezoelectric ceramic material of PZT. The piezoelectric plates 70 and 72 were respectively constructed by pasting together two piezoelectric ceramic plates each measuring 5 mm in width, 18 mm in length and 0.15 mm in thickness, for example. The support plates 74 and 76 are machined to a sufficient size to cause a nickel plate having a width of 5 mm and a thickness of 50 microns to vibrate to a maximum extent. The support plate 74 is provided with bent portions 74a and 74b in the proximity of both ends. The support plate 76 is similarly provided with bent portions 76a and 76b in the proximity of both ends. The piezoelectric plates 70 and 72 are respectively fixed over the substantially central portions of the elastic support plates 74 and 76. The piezoelectric plates 70 and 72 are set parallel to each other and respectively vibrate in the direction of arrows 18 indicated in FIG. 6. The magnitude of an electric field applied to the piezoelectric plates 70 and 72 is controlled to cause the piezoelectric plates 70 and 72 to vibrate to the same extent and in the same direction.

A film connector 80 is pasted to the backside of the IT-CCD 10. This film connector 80 has a connector body 80-1, a pair of parallel integral C-shaped leg members 80-2 and 80-3 respectively formed on both lateral sides of said connector body 80-1, and a plurality of connection members 82 which are prepared from, for example, conductive rubber (The electrical connection of the film connector 80 to the mother board 20 may also be performed by means of soldering or the like.). The underside of both end portions of each of the C-shaped leg members 80-2 and 80-3 is fitted with a plurality of connection members 82. Print wires 84 having the same number as each group of the connection members 82 are impressed on the outer planes of the C-shaped leg members 80-2 and 80-3 so as to conform with the C-shape. The IT-CCD 10 is fixed by adhesive to the upper plane (as viewed from FIG. 6) of the two piezoelectric plates 70 and 72 with the film connector 80 interposed between the underside of the IT-CCD 10 and the upper plane. Later, the C-shaped leg members 80-2 and 80-3 are so bent as to cause each connection member 82 to contact a print wire 86 formed on the surface of the mother board 20 facing the pins 22.

Figure 6:
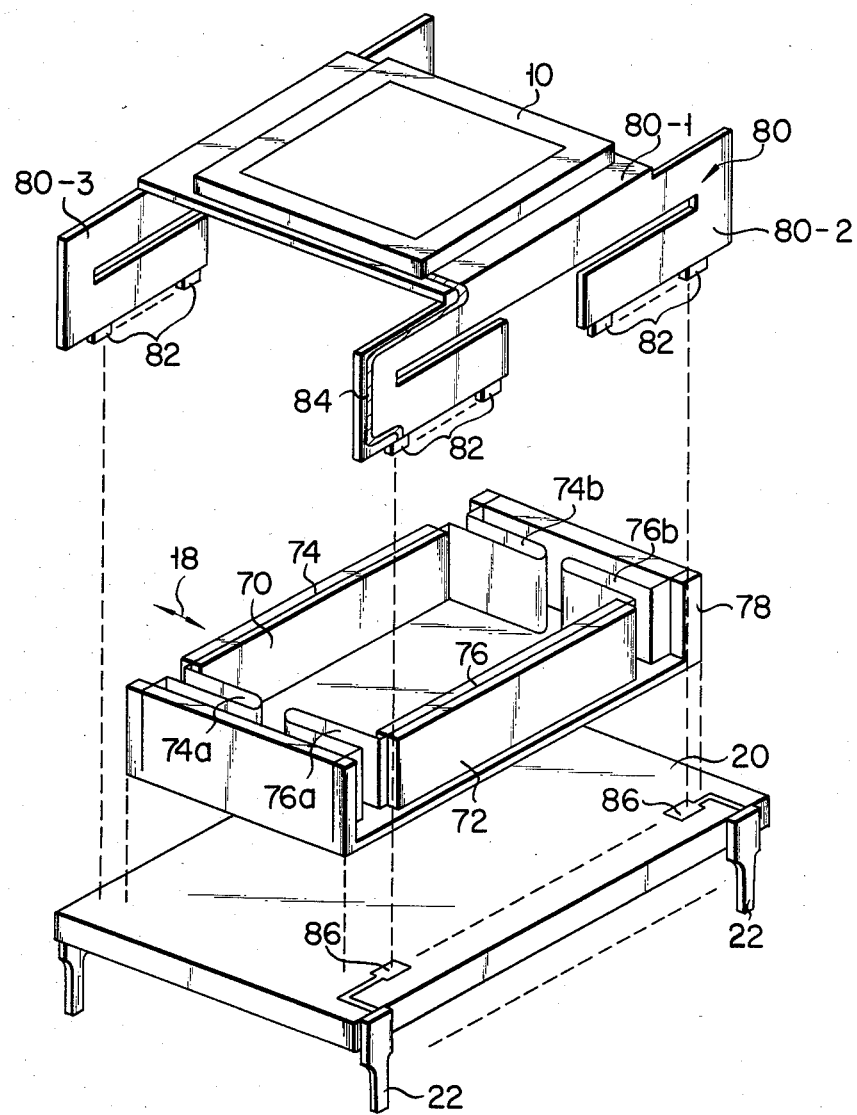
FIG. 6 is an oblique view of the whole of an image-sensing device according to a third embodiment of the invention which comprises two bimorph piezoelectric elements fitted to a thin support plate acting as a spring, thereby effecting the vibration of the IT-CCD image sensor.

With a solid state image sensing device of FIG. 6 according to a third embodiment of this invention, the piezoelectric plates 70 and 72 are mounted on a frame 78 in a floating state by means of the support plates 74 and 76 having a spring function. The piezoelectric plates 70 and 72 substantially float in a space separate from any other members of the subject image sensor-vibrating device. Therefore, the piezoelectric plates 70 and 72 assure a far more extensive vibration of the image sensor, thereby offering a great advantage in vibrating a relatively heavy object (weighing, for example, 5 grams) such as the IT-CCD 10. FIG. 7 experimentally shows a difference between the vibration amplitude realized by a closed side type bimorph piezoelectric element and the vibration amplitude realized by the floating type bimorph piezoelectric element as viewed in connection with the magnitude of voltage applied. Curve 90 denotes the vibration amplitude of an image sensor effected by the closed side type piezoelectric element, and curve 92 indicates the vibration amplitude of an image sensor attained by the floating type piezoelectric element of FIG. 6. FIG. 7 shows that the embodiment of FIG. 6 enables the IT-CCD 10 to vibrate to an extent over three times larger than that which is possible with the closed side type piezoelectric element.

Although the present invention has been shown and described with respect to particular embodiments, various changes and modifications which are obvious to a person skilled in the art to which the invention pertains are deemed to lie within the spirit, scope, and contemplation of the invention.

What we claim is:

1. An image-sensing device applied to an image pickup system in which one frame consists of a plurality of field periods comprising:
   a solid state image sensor element receiving an image light to produce an electrical image pickup signal corresponding to the image light;
   a base board having a top surface;
   vibrating means, mechanically connected to said image sensor element, for receiving an external electrical signal and for vibrating said image sensor element on a plane substantially parallel to the top surface of said base board in response to the external electrical signal so as to cause said image sensor element to periodically vibrate in conformity with the relative positions of said image sensor element and the image light, whereby said image sensor element periodically vibrates in such a manner as to occupy a different image pickup position during a different field period, said vibrating means comprising a piezoelectric element; and
   support means, provided between said base board and said vibrating means, so as to cause said vibrating means to occupy a prescribed position above the top surface of said base board.

2. An image-sensing device according to claim 1, wherein said support means comprises elastic support means for electrically supporting said vibrating means so as to cause said vibrating means to occupy a prescribed position above the top surface of said base board and its vicinity.

3. An image-sensing device according to claim 2, wherein said base board has a plurality of connection pins.

4. An image-sensing device according to claim 2, wherein said vibrating means comprises two bimorph piezoelectric elements each of which is formed in rectangular plate shape.

5. An image-sensing device according to claim 4, wherein said elastic support means comprises supporting plates which elastically support said two bimorph piezoelectric elements at least in the vibrating direction thereof in such a manner that said two bimorph piezoelectric elements face each other in the main plane and are set substantially at right angles to the surface of said base board.

6. An image-sensing device according to claim 4, wherein each of said bimorph piezoelectric elements includes two piezoelectric element components; and wherein said elastic support means includes:
   a pair of parallel wall members which are projectively fixed on the top surface of said base board so as to face each other; and
   a pair of supporting plates interposed between said wall members, each of said support plates having a planar portion interposed between said two piezoelectric element components, and bent portions which are provided between said wall members and said planar portion and which are folded in a prescribed direction.

7. An image-sensing device according to claim 3, wherein said vibrating means includes at least one bimorph piezoelectric element which is formed in a rectangular plate shape; and wherein said supporting means includes a support block which is fixed to the top surface of said base board, and to which one end of said rectangular plate-shaped bimorph piezoelectric element is attached to allow for the vibration of said piezoelectric element above said base board substantially parallel with the top surface of said base board, thereby constituting an open side type vibrating piezoelectric element.

8. An image-sensing device according to claim 7, which further comprises flexible connector means for electrically connecting said image sensor element to said connection pins, said connector means having one portion on which signal transmission patterns are provided and which is fitted to the main plane of said piezoelectric element.

9. An image-sensing device according to claim 8, wherein said image sensor element includes a charge-coupled device which has an image-sensing surface and an opposite surface to the image sensing surface and which is fixed at the opposite surface thereof to that side of the other end of both ends of said rectangular plate-shaped bimorph piezoelectric element which constitutes thickness thereof, said other end being a free end of said piezoelectric element.

10. An image-sensing device according to claim 3, wherein said vibrating means includes two bimorph piezoelectric elements each of which is formed in a rectangular shape; and wherein said support means includes two facing support blocks which are mounted on the top surface of said base board and which fixedly support said two bimorph piezoelectric elements at both ends of each of said bimorph piezoelectric elements in such a manner that said piezoelectric elements face each other, thereby constituting a closed side piezoelectric vibrating element.

11. An image-sensing device according to claim 10, wherein said image sensor element includes a charge-coupled device which has an image-sensing surface and an opposite surface to the image-sensing surface and which is fixed at the opposite surface thereof to a substantially intermediate area in that side of the closed side type piezoelectric vibrating elements which constitutes the thickness of said vibrating elements.

12. An image-sensing device according to claim 11, which further comprises flexible connector means for electrically connecting said charge-coupled device to said connection pins provided to said base board, said connector means having one portion on which signal transmission patterns are provided and which is fitted to the main plane of at least one of said closed side type piezoelectric vibrating elements.

* * * * *